United States Patent [19]

Evans, Jr. et al.

[11] Patent Number: 5,757,042

[45] Date of Patent: May 26, 1998

[54] HIGH DENSITY FERROELECTRIC MEMORY WITH INCREASED CHANNEL MODULATION AND DOUBLE WORD FERROELECTRIC MEMORY CELL FOR CONSTRUCTING THE SAME

[75] Inventors: Joseph T. Evans, Jr.; Richard Womack, both of Albuquerque, N. Mex.

[73] Assignee: Radiant Technologies, Inc., Albuquerque, N. Mex.

[21] Appl. No.: 663,675

[22] Filed: Jun. 14, 1996

[51] Int. Cl.⁶ .......................... H01L 29/76; H01L 29/94; H01L 31/062; H01L 31/113

[52] U.S. Cl. .......................... 257/295; 257/314; 257/352; 257/368

[58] Field of Search .................. 257/295, 314, 257/352, 368

[56] References Cited

U.S. PATENT DOCUMENTS

| | | |
|---|---|---|
| 3,832,700 | 8/1974 | Wu et al. |
| 4,161,038 | 7/1979 | Wu .................................. 365/145 |
| 5,307,305 | 4/1994 | Takasu ............................. 365/145 |
| 5,373,462 | 12/1994 | Achard et al. ................... 365/145 |
| 5,412,596 | 5/1995 | Hoshiba ........................... 365/145 |
| 5,418,389 | 5/1995 | Watanabe ......................... 257/295 |
| 5,449,935 | 9/1995 | Nakamura ........................ 257/295 |
| 5,519,812 | 5/1996 | Ishihara ............................. 395/24 |
| 5,548,475 | 8/1996 | Ushikubo et al. ............... 361/321.4 |
| 5,563,081 | 10/1996 | Ozawa ............................... 437/41 |
| 5,572,052 | 11/1996 | Kashihara et al. ............... 257/295 |
| 5,578,845 | 11/1996 | Masuda et al. .................. 257/295 |
| 5,621,681 | 4/1997 | Moon ............................... 365/145 |
| 5,623,439 | 4/1997 | Gotoh et al. ..................... 365/145 |

*Primary Examiner*—Ngân V. Ngô
*Attorney, Agent, or Firm*—Calvin B. Ward

[57] ABSTRACT

A memory based on a ferroelectric FET, the ferroelectric FET includes a gate electrode, a layer of ferroelectric material, layer of semiconducting material, a source electrode and a drain electrode. The layer of ferroelectric material is sandwiched between the gate electrode and the layer of semiconducting material, the source and drain electrodes being in contact with the layer of semiconducting material and spaced apart from one another. The memory includes a circuit for setting the ferroelectric FET to one of two states. The first state is set by applying a first voltage to the source and drain electrodes and a second voltage to the gate electrode. The second state is set by applying a third voltage to the gate and drain electrodes and fourth voltage to the source electrode. This arrangement reduces the number of pass transistors needed per ferroelectric FET to one plus a simple pulsing circuit that must be included with each word of memory.

7 Claims, 9 Drawing Sheets

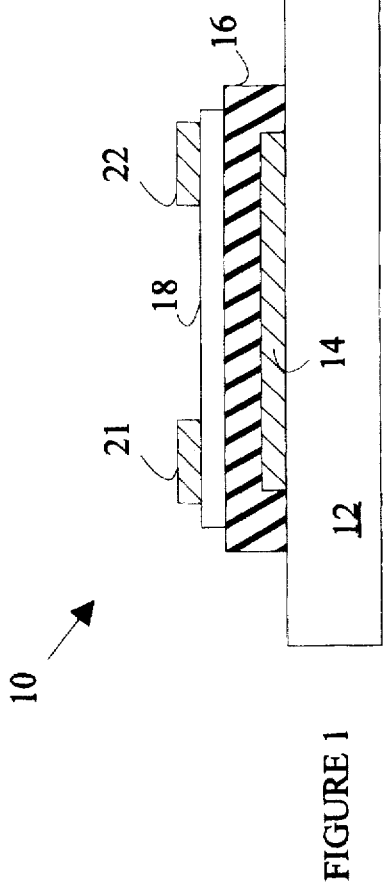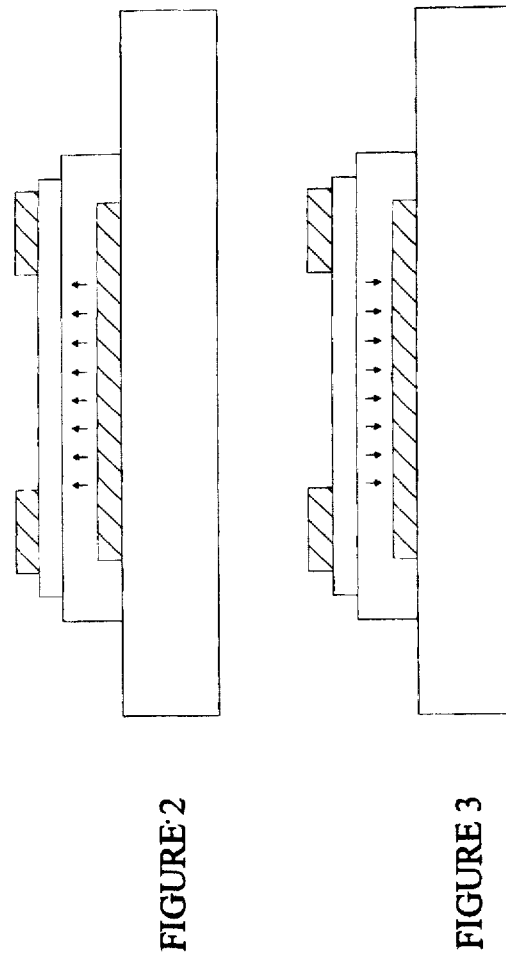
FIGURE 1
FIGURE 2
FIGURE 3

5,757,042

HIGH DENSITY FERROELECTRIC MEMORY WITH INCREASED CHANNEL MODULATION AND DOUBLE WORD FERROELECTRIC MEMORY CELL FOR CONSTRUCTING THE SAME

FIELD OF THE INVENTION

The present invention relates to static memory cells, and more particularly, to an improved memory based on ferroelectric field effect transistors (FETs).

BACKGROUND OF THE INVENTION

U.S. Pat. No. 5,070,385 describes a ferroelectric FET that may be used for constructing memory cells that retain their data even when power is removed from the cell. The memory cell consists of a semiconductor layer that overlies a ferroelectric layer. The direction of polarization of the underlying ferroelectric layer determines the electric field in which the semiconductor layer functions. Data is stored in the direction of polarization of the ferroelectric layer. The data is sensed by measuring the resistivity of the semiconductor layer between two electrodes that are analogous to the source and drain in a conventional FET. The polarization of the underlying FET layer is set by applying voltages across the ferroelectric layer. These voltages are applied with the aid of a third electrode which is analogous to the gate of a conventional FET.

The greatest differences in resistivity between the two possible directions of polarization are obtained by applying the same voltage to the source and drain and a different voltage to the gate. This mode of operation requires that all three terminals be operated separately. As a result, the circuit area needed to construct a memory based on this mode of operation is substantially greater than the area needed for the ferroelectric FETs due to the need to run five separate lines to each memory cell to control two pass transistors and the ferroelectric FET. Hence, while the three terminal operation provides the greatest difference between the resistivities corresponding to the two possible data states, it is less than optimum in terms of cell density in a practical memory.

The smallest cell size is achieved in a mode in which the source is shorted to the gate. In this mode, only one pass transistor and three lines need to be run to each ferroelectric FET. Unfortunately, the difference in resistivity of the semiconductor between the two states of polarization is only about a factor of two. In this two terminal mode, roughly half of the semiconductor layer switches from the high to low resistance state. The half that does not switch remains in the high resistance state. In contrast, all of the semiconductor layer between the source and drain is switched in the three terminal operation. As a result, the resistance observed between the source and drain changes by a factor of roughly 100 when the states are reversed using a three terminal configuration.

Broadly, it is the object of the present invention to provide an improved ferroelectric FET memory cell.

It is a further object of the present invention to provide a ferroelectric memory that requires less area to construct than a memory utilizing ferroelectric FETs operated in three terminal mode while providing greater changes in resistivity than a memory based on ferroelectric FETs operated in two terminal mode.

It is a still further object of the present invention to provide a memory design which requires substantially less area per word than that required by connecting separate ferroelectric FET cells.

These and other objects of the present invention will become apparent to those skilled in the art from the following detailed description of the invention and the accompanying drawings.

SUMMARY OF THE INVENTION

The present invention is a memory based on a ferroelectric FET. The ferroelectric FET includes a gate electrode, a layer of ferroelectric material, a layer of semiconducting material, a source electrode and a drain electrode. The layer of ferroelectric material is sandwiched between the gate electrode and the layer of semiconducting material, the source and drain electrodes being in contact with the layer of semiconducting material and spaced apart from one another. The memory includes a circuit for setting the ferroelectric FET to one of two states. The first state is set by applying a first voltage to the source and drain electrodes and a different voltage to the gate electrode. The second state is set by applying a second voltage to the gate and drain electrodes and a different voltage to the source electrode. This arrangement reduces the number of pass transistors needed per ferroelectric FET to one plus a simple pulsing circuit that must be included with each word of memory.

A single word of memory has N storage cells (N>2). Each storage cell has a pass transistor and a ferroelectric FET. The pass transistor provides a conducting path between the first and second terminals in response to the pass gate being coupled to a predetermined potential, all of the pass gates are connected to a common word line. The drain electrode of the ferroelectric FET is connected to the first terminal of the pass transistor. Data is written into the word by a write circuit that sequentially sets a ferroelectric FET to a first state by holding the source and drain electrodes of the ferroelectric FET at a first potential and the gate electrode at a potential different from the first potential. The write circuit then sets the ferroelectric FET to a second state or a third state depending on the potential on the second terminal of the pass transistor. The second state is written by holding the source and drain electrode at the same potential and the gate electrode at a different potential, and the third state is written by holding the gate and drain electrode at a the same potential and the source electrode at a different potential.

BRIEF DESCRIPTION OF THE DRAWINGS

FIG. 1 is a cross-sectional view of a ferroelectric FET.

FIG. 2 illustrates one of the polarization patterns produced in a ferroelectric FET when data is written by connecting the source and drain.

FIG. 3 illustrates the other polarization pattern produced by writing data in a ferroelectric FET with the source and drain connected together.

DETAILED DESCRIPTION OF THE INVENTION

Figure 4:
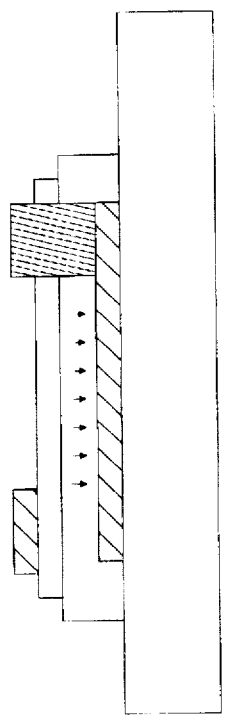
FIG. 4 illustrates one of the polarization patterns produced in a ferroelectric FET when data is written by connecting the source and gate.

The present invention may be more easily understood with reference to FIG. 1 which is a cross-sectional view of a ferroelectric FET 10. Ferroelectric FET 10 is constructed on a substrate 12 by first depositing the gate electrode 14. The ferroelectric layer 16 is then deposited over the gate electrode and etched to the appropriate size. The semiconductor layer 18 is then deposited on the ferroelectric layer and two electrodes 21 and 22 corresponding to the source and drain are deposited on semiconductor layer 18. The choice of which of these electrodes is labeled as the "source" is arbitrary.

As noted above, data is stored in ferroelectric FET 10 by setting the direction of polarization of ferroelectric layer 16. In three terminal operation, the direction of polarization is set by applying a potential difference across ferroelectric layer 16 using a circuit that holds the source and drain at the same potential. For example, the polarization of the ferroelectric layer may set in one direction by applying 5 volts to the source and drain while holding the gate at ground. The opposite state is set by holding the source and drain at ground and applying a potential of 5 volts to the gate. It should be noted that this write scheme results in the direction and magnitude of the polarization of the ferroelectric layer being the same at all points between the source and the drain as shown in FIGS. 2 and 3 which illustrate the polarization of the ferroelectric layer in each of the two data states, respectively.

While the above example utilizes symmetric voltages to write the first and second states into the ferroelectric FET, it will be apparent to those skilled in the art that two different potential differences could equally be used. For the purposes of the following discussion, a three terminal write operation will be defined as any write operation in which the source and drain are held at a first potential while the gate is held at a second potential that differs from the first potential.

Figure 5:
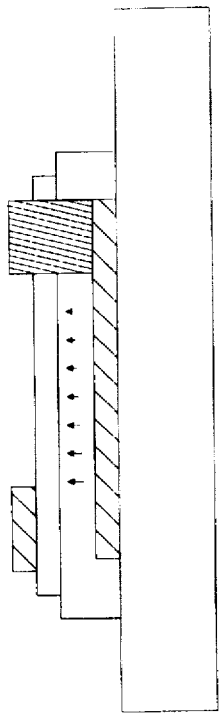
FIG. 5 illustrates the other polarization pattern produced by writing data in a ferroelectric FET with the source and gate connected together.

As pointed out above, this mode of operating the memory cell requires that separate conductors be run to each of the electrodes on the memory cell, and hence, the area required to construct a word of memory is substantially greater than the area occupied by the ferroelectric FETs of that word. A substantial reduction in word area can be achieved by operating the memory in a two terminal mode in which the source of each ferroelectric FET is connected to the gate of that ferroelectric FET. The polarization of the ferroelectric layer in this mode is more complex than that shown in FIGS. 2 and 3. Since the gate and source are connected to the same potential, no potential difference is generated across the portion of the ferroelectric layer under the source. The potential difference between the portion of the ferroelectric layer under the drain can be switched from fully up to fully down as shown in FIGS. 4 and 5. The magnitude of the polarization at the intermediate points between the source and drain is less than that obtained in three terminal operation because the potential at each point is reduced by the voltage drop from the drain to the point in question along the semiconductor layer. The resultant polarization is a complex function that depends on the coercive voltage of the hysteresis curve of the ferroelectric material in the ferroelectric layer.

The three terminal configuration shown in FIGS. 2 and 3 can be programmed such that the high resistance state, i.e., the memory state in which the portion of the semiconductor layer between the source and drain is the highest, is of the order of $10^7$ ohms while the low resistance state is of the order of $10^5$ ohms. In the following discussion, the "throw" of a ferroelectric FET will be defined to be the ratio of the high resistance state to the low resistance state. Hence, when operated in the three terminal configuration, the throw of a ferroelectric FET is of the order of 100.

When operated in the two terminal mode described above, the throw is reduced to 2–3. The low throw values are further complicated by process variability across the die when a memory is constructed from the ferroelectric FETs. While these problems can be corrected, in principle, by including calibration ferroelectric FETs in every word, the added space and complexity makes this solution unattractive.

The present invention is based on the observation that the two terminal device fails to provide adequate throw because of the problems encountered in writing the low resistivity state into the PZT layer. As noted above, only about half of the channel between the source and drain electrodes can be switched to the low resistance state in the two terminal mode. The remaining portion of the channel remains in the high resistance state. It is this residual high resistance area that causes the poor throw values.

The present invention solves this problem by writing the low resistance state in a mode in which the source and drain are held at the same voltage. The high resistance state is written in the two terminal mode, i.e., the drain and gate at the same potential. To accomplish this mode of writing a small switching circuit is added to each word of the memory. While this switching circuit occupies space, and hence, increases the area needed to construct a word of memory, the additional space is still less than that required by a memory word operated in the conventional 3 terminal mode.

Figure 6:
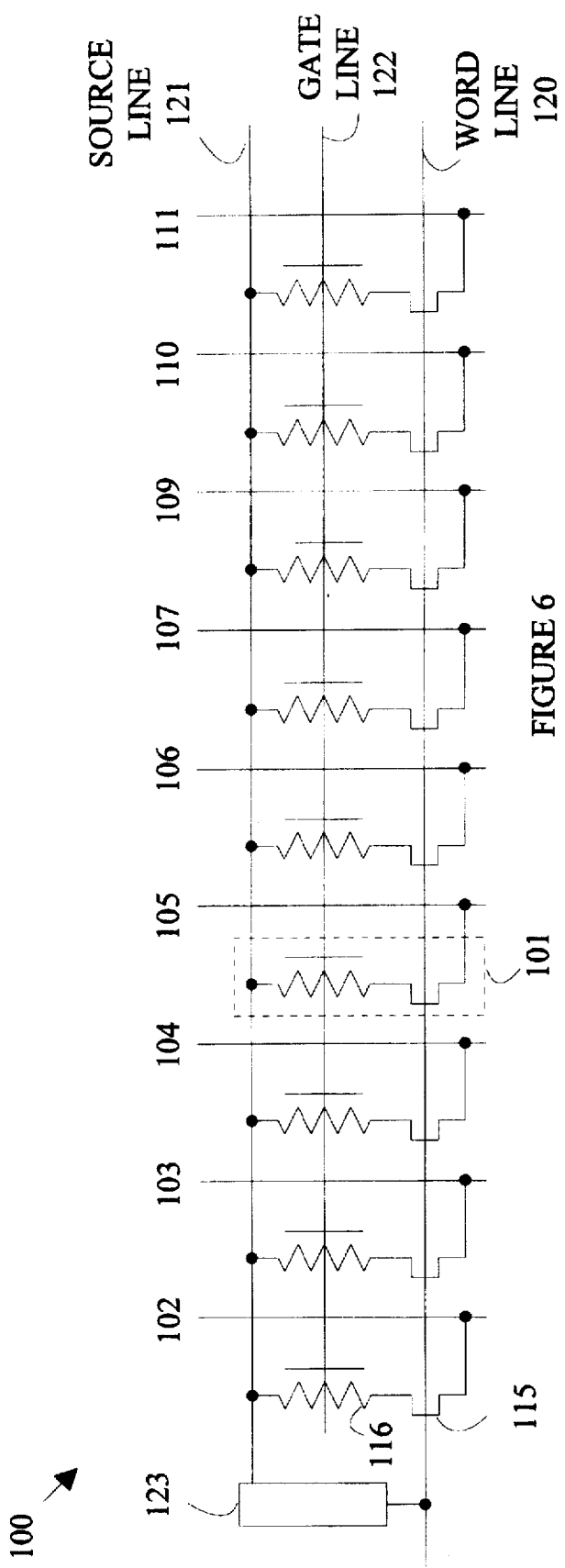
FIG. 6 is a schematic drawing of a one word memory cell according to the present invention.

Refer now to FIG. 6 which is a schematic drawing of a one word memory cell 100 according to the present invention. Memory cell 100 has nine single bit storage cells of which storage cell 101 is typical. Each storage cell includes a ferroelectric FET 116 and a pass transistor 115. Each storage cell connects a source line 121 to one of the bit lines. The bit lines are shown at 102–111. All of the gates of the ferroelectric FETs are connected to a common gate line 122, and all of the sources of the ferroelectric FETs are connected to a common source line 121.

Figure 7:
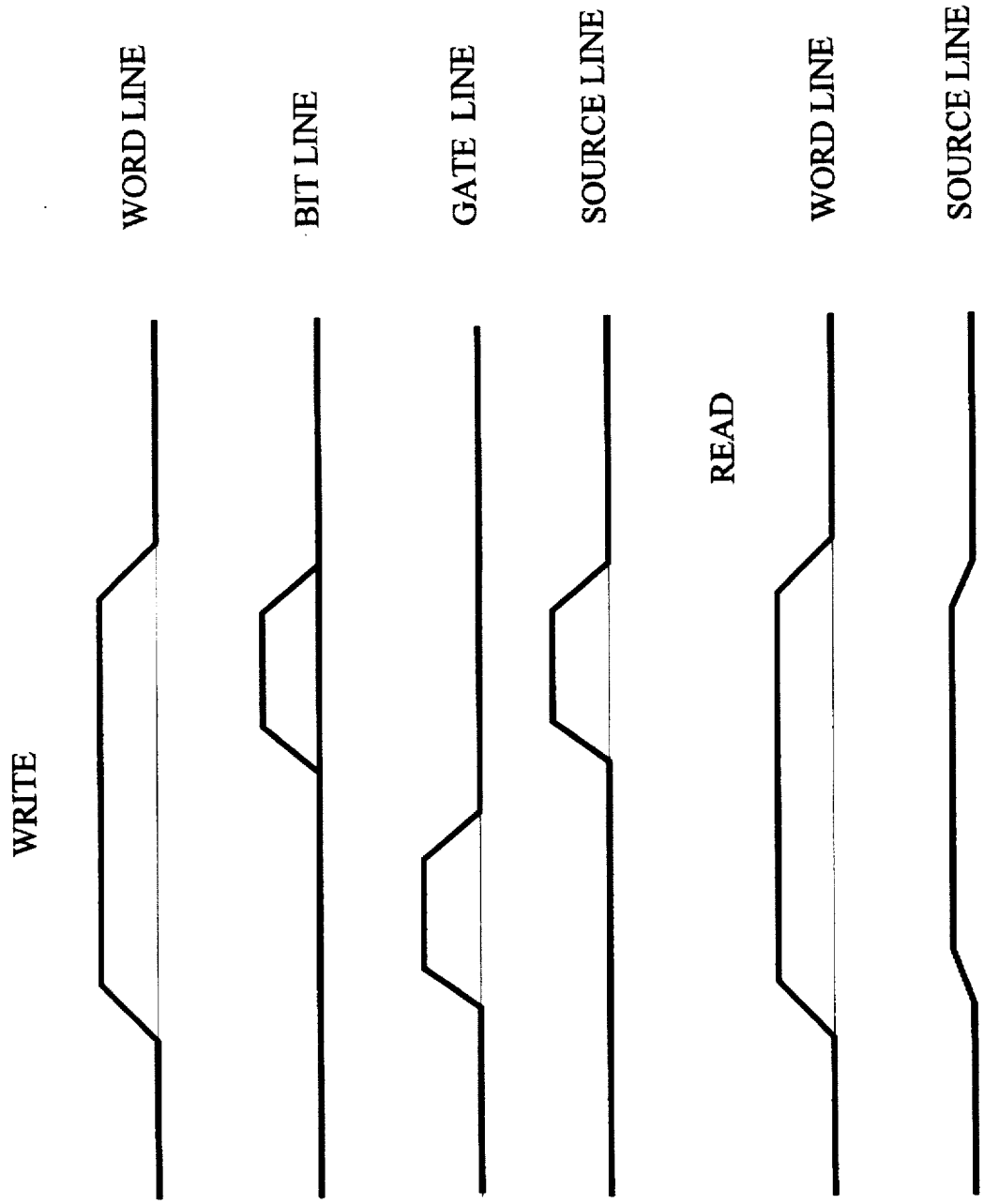
FIG. 7 illustrates the signals used to read and write the data in the word shown in FIG. 6.

The source and word lines are driven as explained below. A word is selected by driving its word line 120. A pulse circuit 123 pulses the source line at the appropriate time to provide the three terminal write in the currently selected word. Data is written into the word by placing the data on the bit lines as shown in FIG. 7 which illustrates the signals used to read and write the data in the word. The pulse on the gate line in the first half of the write cycle sets the channel between the source and drain to the high resistance state in what is effectively a 3 terminal write mode, i.e., source and drain are at the same potential. If the bit line is high when the pulse on the source line during the second half of the write cycle is applied, then low resistance state will written into the channel in the three terminal mode also, since the source and drain will be at the same potential. If the bit line is low when the source line is pulsed, then the gate and the drain will be at the same potential which corresponds to a two terminal write of a high state into the channel.

It should be noted that during a read operation, the voltage applied to the source line is maintained at a value that is sufficiently small to assure that the data stored in the word will not be altered by the read operation. The current on the bit line is measured to determine the data stored in the ferroelectric FET.

In the following discussion it will be assumed that the rise time of the pulse on the source line is greater than the RC time constant determined by the resistance of a ferroelectric FET in its high resistance state and the capacitance of the drain to the substrate. If the source line is pulsed and pass transistor 115 is not conducting, no data will be written into the word. As will be explained in detail below, significant savings in the area of a memory made from ferroelectric FETs according to the present invention may be achieved by using both the source and word lines to perform addressing functions.

It should also be noted that the selection of a word for reading or writing requires that both the word and source lines be enabled. As will be explained in detail below, significant savings in the area of a memory made from ferroelectric FETs according to the present invention may be achieved by using both the source and word lines to perform addressing functions. Consider the case in which a word is not selected by both the word and source lines. This word must not be written. This word will have its pass gate off and its source line floating. When the gate is pulsed, the contents of the word must not be disturbed. Since the drive transistors for the source line (in pulse circuit 123) and the pass gates of the word are all off, their diffusion contacts connected to the ferroelectric devices form leaky capacitors connecting these lines to the substrate. In this situation, the gate pulses and the source line, channels, and ferroelectric FET drains all rise with the gate. Hence, the gate pulse width must be shorter than RC time constant of the ferroelectric FET top structures (source line, channels, and ferroelectric FET drains) so that the potential on these structures does not appreciably change during the pulse and remains at the same potential as the gate. The capacitive coupling of the source and gate lines helps to assure that the source and gate lines rise together. However, when an actual write is to be performed, the source line potential is driven in the opposite direction from that of the gate. Here, the parasitic capacitance between the source and gate detracts from circuit performance. Hence, the designer must adjust the parasitic capacitance to balance the speed of the write on an active bit with the requirement that an inactive bit not be disturbed when an active bit in another word is being written.

Figure 8:
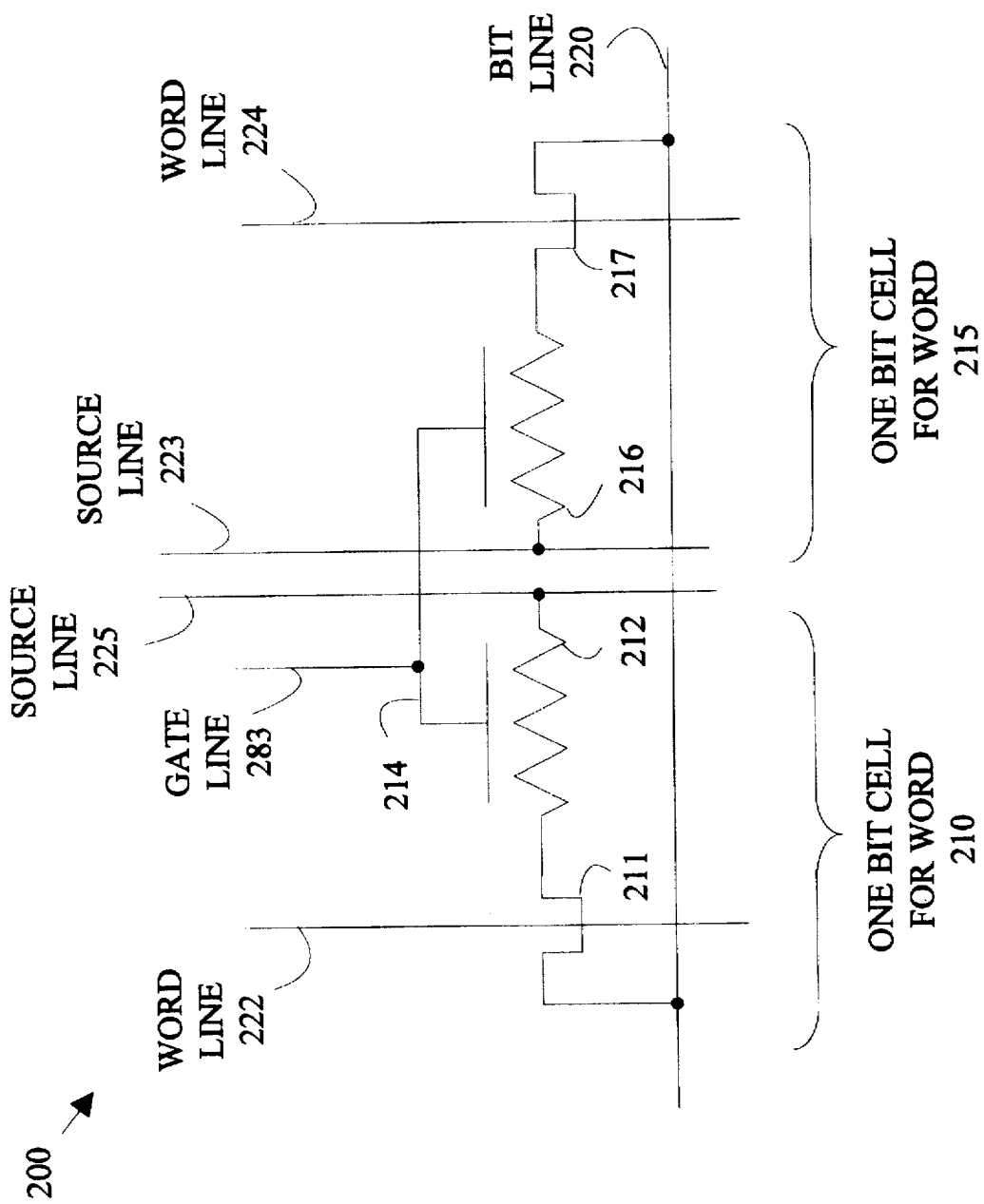
FIG. 8 is a schematic drawing of a two bit memory cell according to the present invention.
Figure 9:
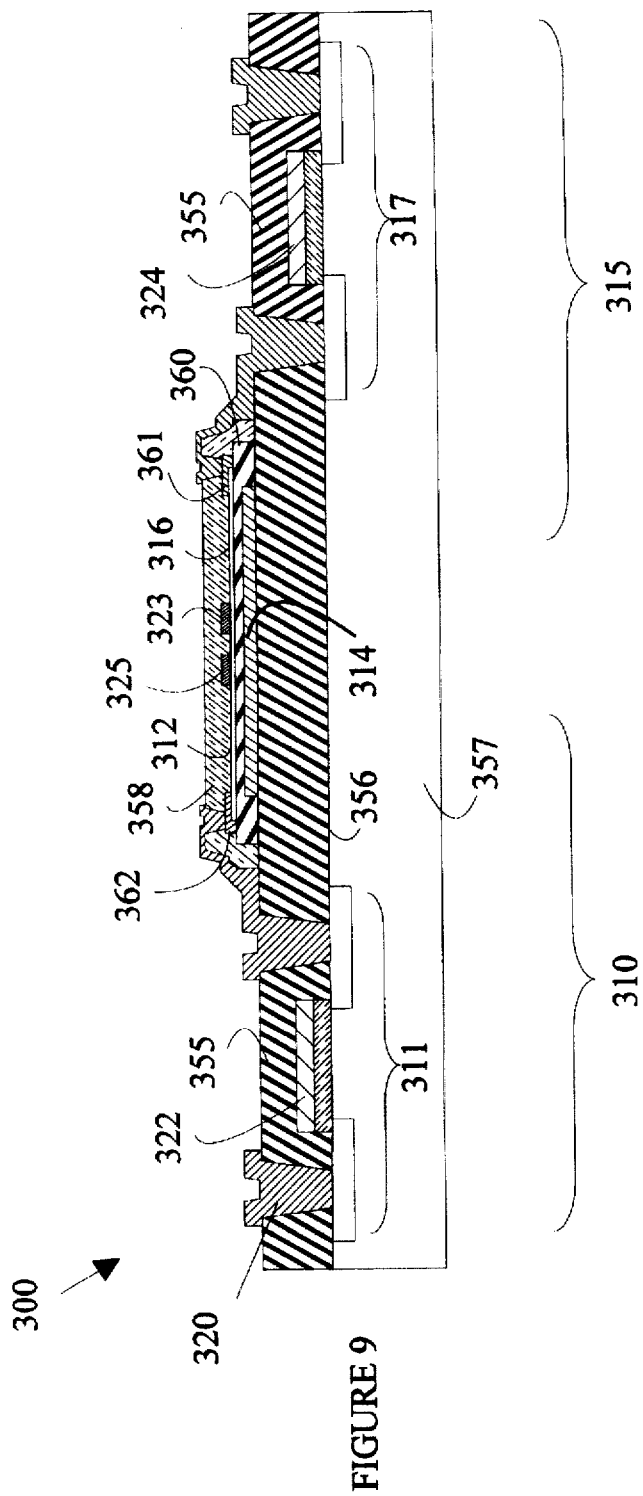
FIG. 9 is a cross-sectional view of a memory cell according to the present invention as it is preferably constructed on a silicon substrate.

The area occupied by each single bit cell can be further reduced by constructing the memory from cells containing two bits in which the gate lines of the two bits are shared. Refer now to FIGS. 8 and 9 which illustrate such a two bit memory cell. FIG. 8 is a schematic drawing of a two bit memory cell 200 according to the present invention. FIG. 9 is a cross-sectional view of a two bit memory cell 300 as it is preferably constructed on a silicon substrate. Elements that serve the same function in each drawing having been assigned numbers that differ by 100. Each two-bit memory cell 200 corresponds to two bits in different words connected to the same bit line 220. The bit corresponding to word 210 is constructed from pass transistor 211 and a ferroelectric FET 212 and is selected utilizing word line 222. The bit corresponding to word 215 is constructed from pass transistor 217 and ferroelectric FET 216 and is selected via word line 224. The sources of the two ferroelectric FETs are connected to source line 223 and 225 which are also connected to all of the other FET sources in each of the two words. The gates of the two FETs are constructed from a common electrode as shown at 214. The gates are likewise connected to a common gate line 283.

Refer now to FIG. 9 which is a cross-sectional view through the preferred implementation of a two bit memory cell 300 such as that shown schematically in FIG. 8. Two bit memory cell 300 provides storage for two bits shown at 310 and 315 corresponding to bit cells 210 and 215 shown in FIG. 8. Two bit memory cell 300 is constructed by first constructing the two pass transistors 311 and 317 in a silicon substrate 357 using conventional CMOS fabrication techniques. Pass transistors 311 and 317 and the silicon substrate between these transistors are then covered with a layer of $SiO_2$ 356. The common gate electrode 314 is then deposited on the $SiO_2$ layer and covered with a layer of PZT 360. A patterned semiconductor layer 316, preferably Indium Oxide, is then deposited on PZT layer 360. The electrodes corresponding to the two drains of the ferroelectric FETs are then deposited together with the electrodes corresponding to the common separate source connections. These electrodes are shown at 361, 362, 325, and 323, respectively. The ferroelectric FET is then covered with a layer of $TiO_2$ and $SiO_2$ as shown at 358. Vias are opened in layers 356 and 358 to provide connections to the source and drain electrodes of the pass transistors and the ferroelectric FETs. A typical via that has been filled with metal is shown at 320. A via is opened to common gate electrode 314. Similarly, vias are opened to common source electrodes 323 and 325 of the ferroelectric FETs. However, this via is at the end of the word, and hence, is out of the cross-sectional view shown in the drawing. Similarly, vias are opened in the $SiO_2$ layers shown at 355 to allow connections to be made to the gates of pass transistors 311 and 317. A patterned metal layer is then deposited over the vias to provide the remaining connections.

Figure 10:
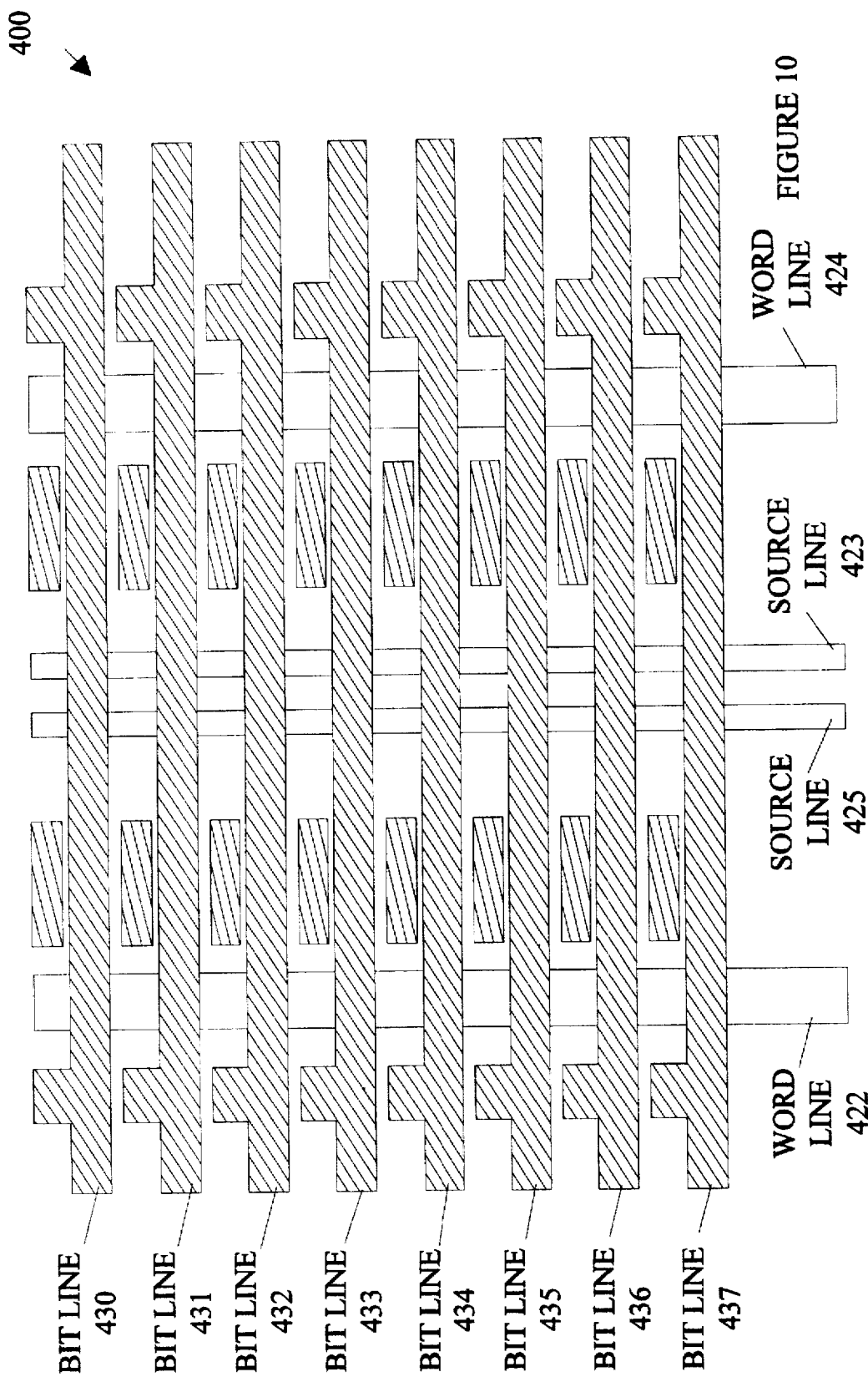
FIG. 10 is a top view of a two word block of memory constructed from two bit memory cells according to the present invention.

Refer now to FIG. 10 which is a top view of a two word block of memory 400 constructed from two bit memory cells such as two bit memory cell 300 discussed above. Each word has 8 bits. Each pair of bits are connected to a corresponding bit line. The bit lines are shown at 430–437. Each of the pass transistor gates is connected to a word line which runs at right angles to the bit lines. The two word lines are shown at 422 and 424 respectively. The source lines 423 and 425 also run at right angles to the bit lines. Each source line is an electrode and it connects to pulse circuit 123 at the end of each word. Each of the word lines and the source lines are connected to the corresponding underlying electrodes by a single metal connection through a via at one end of the memory block. In the preferred embodiment of the present invention, the ferroelectric layer for each pair of words constructed from two-bit memory cells is common to all of the bits. That is, a single ferroelectric layer is deposited over the area occupied by the words. These three connections lie under the corresponding metal layers, and hence, are not visible in the drawing. The ferroelectric layer must, however, be removed over the pass transistors to allow vias to the CMOS transistors to be opened.

As noted above, both the word line and gate line must be pulsed to write a word into a memory according to the present invention. This observation may be used to further reduce the area needed to construct a memory using the memory cells of the present invention. To obtain the highest density memory, the memory cells are arranged in a rectangular array having a plurality of rows and columns. All of the word lines in a given row are connected together and all of the gate lines in each column are connected together. The high order bits of the memory address can then be used to specify the row and the low order bits used to specify the column, or vice versa.

Figure 11:
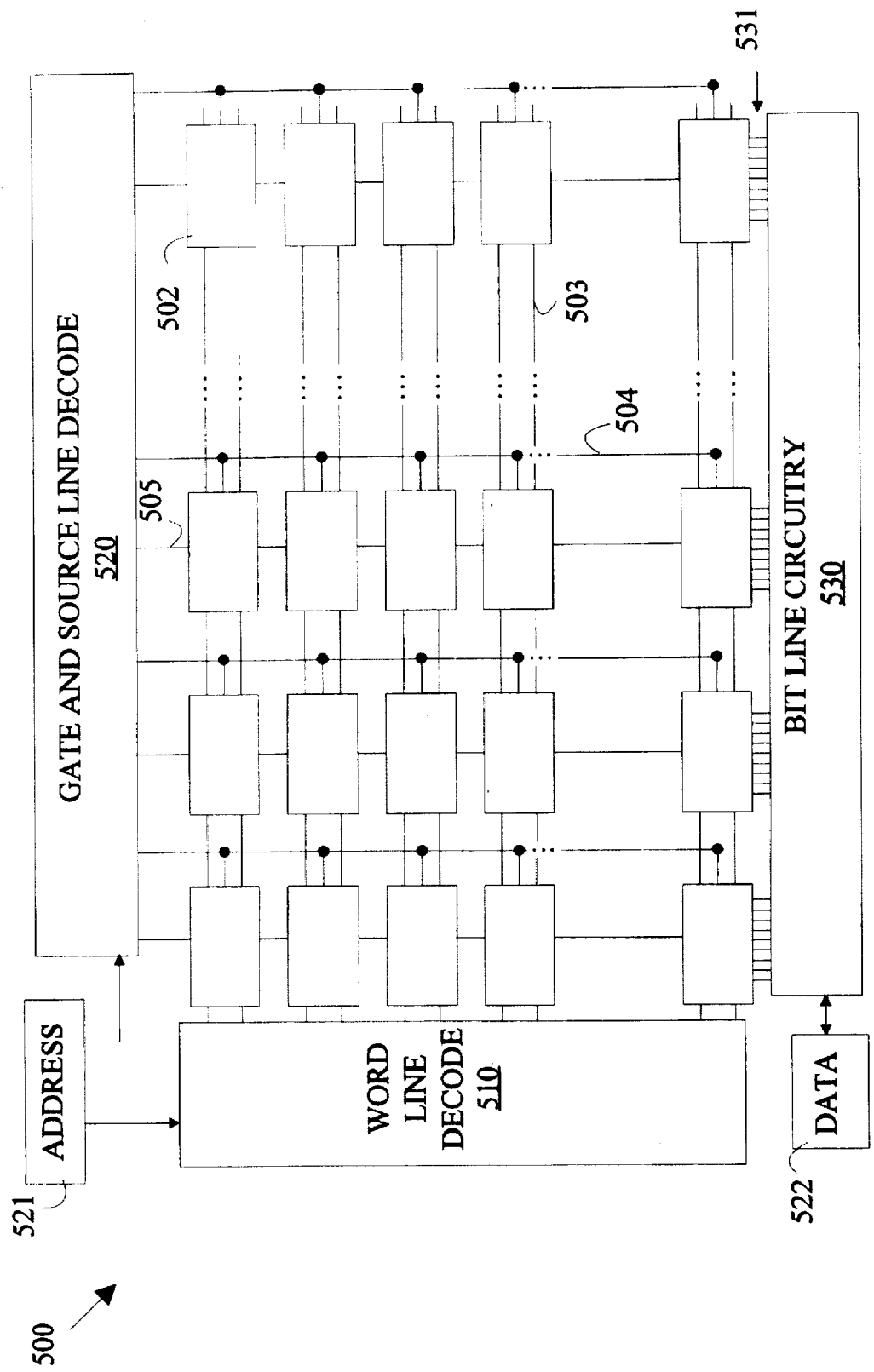
FIG. 11 is a block diagram of a high density memory 500 according to the present invention.
Figure 12:
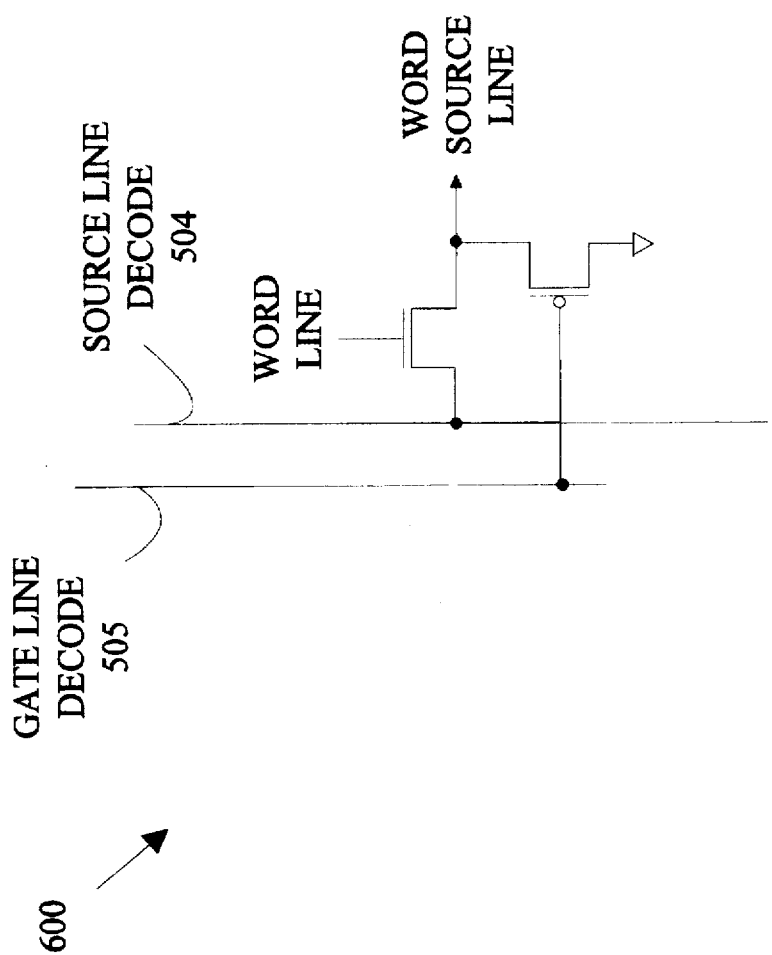
FIG. 12 is a schematic drawing of the preferred embodiment of a pulse circuit for use in the present invention.

Refer now to FIGS. 11 and 12. FIG. 11 is a block diagram of a high density memory 500 according to the present invention. FIG. 12 is a schematic drawing of the preferred embodiment of pulse circuit 600. Pulse circuit 600 provides the functionality of pulse circuit 123 shown in FIG. 6. Memory 500 is preferably constructed from a plurality of two bit memory cells of which cell 502 is typical. The cells are connected in rows and columns such that all memory cells in a given column are connected to the same vertical metal line via the common gate line 505. The common source line of each word connects to a dedicated pulse circuit such as pulse circuit 600. Each of the pulse circuits are connected to a common vertical decoded source line. A typical source line connection is shown at 504. Only the pulse circuit on the active word line with an active vertical source line will pulse its word level source line during a write. All of the word lines in each row are connected together. A typical word line connection is shown at 503. A word line decode circuit 510 decodes the high order bits of the address in register 521 to select the correct word line. A source and gate line decode circuit 520 uses the low order bits of the address in register 521 to select the correct source and gate lines. The decode circuits are assumed to include the appropriate drive circuitry in this exemplary circuit. The bit lines from the various words are processed by a bit line multiplexer/demultiplexer shown at 530. The bit lines have been omitted from the drawing to simplify the drawing; however, it is to be understood that bit lines run vertically through all of the columns of bits and terminate in multiplexer 530 as shown at 531. Data in register 522 to be written to the address in register 521 is placed on the appropriate bit lines by circuit 530. Similarly, data that is read from the address is placed in register 522 by circuit 530.

Memory 500 achieves its high density because the space needed between the various columns is only that needed to run the vertical conductors for connection to the source lines and pulse circuits 123 discussed above with reference to FIG. 6. Similarly, the space that must be allocated between each row of memory cells is only that needed to run the horizontal conductors connecting the various word lines to the memory cells. The various drivers have been moved to the edges of the array and are shared by the various words. Hence, no space must be allocated for drive circuitry within the array.

Each gate line is common to all of the words in a column. The gate line is only pulsed on the currently selected column. In this mode, the gate line is decoded just as the source line is decoded. This is necessary to prevent the pulsing of those unselected words on the active word line. The non-selected cells on the active word line have pass transistors in a conducting state so that the bit line is connected to the ferroelectric FET drain. If the gate line were pulsed in this condition, the bit line state would be written into those cells. Hence, for the unselected words on the active word line, the bit lines must all be at ground, and neither the source lines nor gate lines may be pulsed.

The source line for a column, i.e., line 504 in FIG. 11, is pulsed when a word in its column is selected. The source line pulse reaches pulse circuit 123 shown in FIG. 6 for each word in the column. The word line controls pulse circuit 123 so that only the source line of the word with active word line actually pulses in its memory cell. Since the gate line is common to all words in the column, it will pulse on unselected words with inactive word lines. In those cells in which the gate line pulses and the word line is off, the source line of that word floats so that the gate pulse does not disturb the ferroelectric FET state. It should be noted that if the source line were grounded during the gate line pulse, the ferroelectric FET would be written.

While memory 500 has been described in terms of words constructed from two bit memory cells sharing a common gate electrode, it will be apparent to those skilled in the art that memory 500 could also have been constructed from single bit memory cells. However, such a design would require more circuit area than memory 500, and hence, is not preferred.

The above described embodiments of the present invention have been discussed in terms of a ferroelectric FET that is constructed on top of a substrate having a CMOS transistor constructed therein. However, it will be apparent to those skilled in the art from the above discussion that other configurations of ferroelectric FET transistors are possible. For example, the semiconducting layer of the ferroelectric FET could, in principle, be constructed in the silicon substrate and the ferroelectric layer constructed thereover.

Various modifications to the present invention will become apparent to those skilled in the art from the foregoing description and accompanying drawings. Accordingly, the present invention is to be limited solely by the scope of the following claims.

What is claimed is:

1. A memory comprising a ferroelectric FET, said ferroelectric FET comprising a gate electrode, a layer of ferroelectric material, layer of semiconducting material, a source electrode and a drain electrode, said layer of ferroelectric material being sandwiched between said gate electrode and said layer of semiconducting material, said source and drain electrodes being in contact with said layer of semiconducting material and spaced apart from one another;

a circuit for setting said ferroelectric FET to one of two states, said first state being set by applying a first voltage to said source and drain electrodes and a different voltage to said gate electrode, and said second state being set by applying a second voltage to said gate and drain electrodes and different voltage to said source electrode.

2. A circuit for storing a word, said circuit comprising:

N single bit memory cells, wherein N>2, each of said single bit memory cells comprising a pass transistor and a ferroelectric FET, said pass transistor including a pass gate and first and second terminals, said pass transistor providing a conducting path between said first and second terminals in response to said pass gate being coupled to a predetermined potential, all of said pass gates being connected to a common word line, said ferroelectric FET comprising a gate electrode, a layer of ferroelectric material, layer of semiconducting material, a source electrode and a drain electrode, said layer of ferroelectric material being sandwiched between said gate electrode and said layer of semiconducting material, said source and drain electrodes being in contact with said layer of semiconducting material, wherein said drain electrode of said ferroelectric FET is connected to said first terminal of said pass transistor; and a write circuit for sequentially setting one of said ferroelectric FETs to a first state by holding said source and drain electrodes of said ferroelectric FET at a first potential and said gate electrode at a potential different from said first potential, and then setting said ferroelectric FETs to a second state or a third state depending on the potential on said second terminal of said pass transistor, said second state being written by holding said source and drain electrode at the same potential and said gate electrode at a different potential, and said third state being written by holding said gate and drain electrode at a the same potential and said source electrode at a different potential.

3. The circuit of claim 2 wherein said ferroelectric layer in each of said single bit memory cells comprises a portion of a common ferroelectric layer that is shared by all of said ferroelectric FETs, each of said ferroelectric FETs occupying a portion of said common ferroelectric layer with a portion of said ferroelectric layer between said ferroelectric FETs remaining unoccupied, and wherein each of said gate electrodes in said ferroelectric FETs is connected to a common gate electrode.

4. A circuit for storing two words, said circuit comprising:

N two bit memory cells, wherein N>2, each of said two bit memory cells comprising first and second pass transistors and a two bit ferroelectric storage cell, each of said pass transistors including a pass gate and first and second terminals, said pass transistor providing a conducting path between said first and second terminals in response to said pass gate being coupled to a predetermined potential; and said two bit ferroelectric storage cell comprising a gate electrode, a layer of ferroelectric material, layer of semiconducting material, first and second source electrodes and first and second drain electrodes, said layer of ferroelectric material being sandwiched between said gate electrode and said layer of semiconducting material, said source and drain electrodes being in contact with said layer of semiconducting material, wherein said first drain electrode of said two bit ferroelectric storage cell is connected to said first terminal of said first pass transistor and said second drain electrode of said two bit ferroelectric storage cell is connected to said first terminal of said second pass transistor;

wherein all of said gate electrodes in said circuit are connected to a common gate electrode, all of said first source electrodes are connected to a first common source electrode, and all of said second source electrodes are connected to a second common source electrode.

5. The circuit of claim 4 wherein said ferroelectric layer in each of said two bit ferroelectric storage cells comprises a portion of a common ferroelectric, each of said ferroelectric layers of said two bit ferroelectric storage cells being a portion of said common ferroelectric layer with a portion of said ferroelectric layer between said ferroelectric FETs being unoccupied.

6. A memory comprising:

a plurality of word storage cells organized into a rectangular array including a plurality of columns and rows, each of said word storage cells comprising:

a plurality of single bit memory cells, each of said single bit memory cells comprising a pass transistor and a ferroelectric storage element, said pass transistor including a pass gate and first and second terminals, said pass transistor providing a conducting path between said first and second terminals in response to said pass gate being coupled to a predetermined potential; and said ferroelectric storage element comprising a gate electrode, a layer of ferroelectric material, layer of semiconducting material, a source electrode and a drain electrode, said layer of ferroelectric material being sandwiched between said gate electrode and said layer of semiconducting material, said source and drain electrodes being in contact with said layer of semiconducting material, wherein said drain electrode of said ferroelectric storage element is connected to said first terminal of said pass transistor, and wherein all of said gate electrodes in said word storage cell are connected to a common gate electrode and all of said source electrodes in said word storage cell are connected to a common source.

wherein all of said common gate electrodes in each one of said columns are connected electrically to a column electrode corresponding to that column and all of said pass gates in each of said rows are connected electrically to a row electrode corresponding to that row.

7. The memory of claim 6 further comprising:

means for receiving an address comprising a plurality of bits divided into first and second groups of bits;

means for selecting one of said column electrodes, said selection depending on said first group of bits; and means for selecting one of said row electrodes, said selection depending on said second group of bits.

* * * * *